United States Patent [19]
Gijs et al.

[11] Patent Number: 5,527,626
[45] Date of Patent: Jun. 18, 1996

[54] MAGNETO-RESISTANCE DEVICE, AND MAGNETIC HEAD COMPRISING SUCH A DEVICE

[75] Inventors: Martinus A. M. Gijs; Jacobus B. Giesbers, both of Eindhoven, Netherlands

[73] Assignee: U.S. Philips Corporation, New York, N.Y.

[21] Appl. No.: 562,247

[22] Filed: Nov. 22, 1996

Related U.S. Application Data

[63] Continuation of Ser. No. 306,343, Sep. 15, 1994, abandoned.

[30] Foreign Application Priority Data

Sep. 24, 1993 [EP] European Pat. Off. .............. 93202759

[51] Int. Cl.$^6$ .................................................. G11B 5/127
[52] U.S. Cl. ..................... 428/611; 428/612; 428/687; 428/928; 428/621; 360/113
[58] Field of Search .................... 428/611, 635, 428/621, 612, 928, 687; 360/113

[56] References Cited

U.S. PATENT DOCUMENTS

| | | | |
|---|---|---|---|
| 3,334,956 | 6/1963 | Staunton | 350/162 |
| 3,542,453 | 11/1970 | Kantar | 350/162 |
| 5,134,533 | 7/1992 | Friedrich et al. | 360/113 |

OTHER PUBLICATIONS

Table of Periodic Properties of Elements, 1962, Sargents–Welch Scientific Co., Catalog No. 5–18806.
Gijs et al in Phys. Rev. Lett. 70 (1993), pp. 3343–3346.
Matsuoka et al in J. Elecxtrochem. Soc. 133 (1986), pp. 2485–2491.
Jimbo et al in Jp. J. Appl. Phys. 31 (1992), pp. L 1348–L 1350.

*Primary Examiner*—David A. Simmons
*Assistant Examiner*—Linda L. Gray
*Attorney, Agent, or Firm*—John C. Fox; Norman N. Spain

[57] ABSTRACT

A magneto-resistance device comprises a stacked structure, which stacked structure has a non-conducting substrate having a surface on which a multilayer structure is provided. The surface is furnished with a plurality of grooves which are substantially mutually parallel, each groove comprising a first and a second face. All first faces are substantially planar and mutually parallel. The constituent layers of the multilayer structure are provided in a stack upon each first face in such a manner as to be parallel thereto, the thickness of the stacks being such that each stack makes physical contact with each immediately neighbouring stack.

15 Claims, 6 Drawing Sheets

MAGNETO-RESISTANCE DEVICE, AND MAGNETIC HEAD COMPRISING SUCH A DEVICE

This is a continuation of application Ser. No. 08/306,343, filed Sep. 15, 1994, now abandoned.

BACKGROUND OF THE INVENTION

The invention relates to a magneto-resistance device comprising a stacked structure, said stacked structure comprising a substrate having a surface on which a multilayer structure is provided.

The invention also relates to a magnetic head comprising such a magneto-resistance device.

Magneto-resistance is that phenomenon whereby the electrical resistance measured along a given path within an appropriate material is found to be influenced by the presence of a magnetic field intersecting the material. The phenomenon can thus be exploited to transcribe probed magnetic field fluctuations into accurately measurable to resistance variations within the material, thereby lending itself to application in fine magnetic field sensors and magnetic heads. Such magnetic heads are used for transferring information to and from a magnetic recording medium, such as a magnetic tape or disc.

The magnitude of the magneto-resistance effect along a given path in a particular material is rendered by the formula:

$$MR = \frac{(R_0 - R_F)}{R_0} \quad (1)$$

in which $R_0$ is the electrical resistance measured along the said path in the absence of a magnetic field, and $R_F$ is the smallest electrical resistance measurable along the same path in the presence of a variable magnetic field. The value of MR is usually expressed as a percentage, and is preferably as large as possible so as to yield maximum attainable sensitivity in sensor applications such as those mentioned above.

A magneto-resistance device as hereabove described is elucidated in U.S. Pat. No. 5,134,533, in which the stacked structure consists of a planar non-conducting substrate which is alternately provided with thin layers of ferromagnetic material (preferably Fe, Co or Ni) and thin layers of non-magnetic material (preferably Cr, V or Ti), the former being antiferromagnetically coupled across the latter and having an in-plane easy axis of magnetisation, the total thickness of the multilayer structure thus formed being of the order of a micron. The electrical resistance of such a stacked structure can be measured by applying a known electrical voltage gradient across the plane of the substrate, thereby inducing a measurable lateral flow of electrical current across the multilayer structure, the ratio of the said electrical voltage and electrical current yielding the value of the electrical resistance. The values thus measured, in both the absence and presence of an external magnetic field, can be employed to calculate the magneto-resistance effect using Formula (1) in the previous paragraph. Typical values of the magneto-resistance effect thus attained with the known stacked structure are of the order of 20%.

In experiments leading to the invention, the magnitude of the magneto-resistance effect demonstrated by such a stacked structure was investigated using an alternative measuring geometry, for which the applied electrical voltage gradient was perpendicular to the multilayer structure, together with the induced flow of electrical current. It was hereby observed that the magneto-resistance effect obtained using this alternative (perpendicular) measuring geometry was considerably larger than that obtained with the common (lateral) measuring geometry, by as much as a factor of five. See, for example, the article by Gijs et at. in Phys. Rev. Lett. 70 (1993), pages 3343–3346.

However, an attendant disadvantage of this perpendicular measuring geometry compared to the lateral measuring geometry is that the absolute values of the electrical resistances measured in the former case are drastically lower than those measured in the latter case, as a result of the huge magnitude-difference between the dimensions of the multilayer structure in the perpendicular direction (of the order of a micrometer) and in the lateral directions (of the order of 100 micrometers, or larger). Such tiny resistance values lead to increased electrical power consumption in magneto-resistance devices employing the perpendicular measuring geometry.

A trivial solution to this problem is to simply increase the total thickness of the multilayer structure to macroscopic values approaching the structure's lateral dimensions, thereby simultaneously increasing the perpendicular resistance of the structure. This, however, is an extremely inefficient, expensive and impracticable measure, in view of the lengthy and costly deposition processes and the relatively large quantities of precious metals which it necessitates. It is of little appeal as a viable solution.

OBJECTS AND SUMMARY OF THE INVENTION

It is an object of the invention to provide a practical magneto-resistance device having a multilayer structure which demonstrates a large magneto-resistance effect for the perpendicular measuring geometry, without the absolute electrical resistances thus measured being undesirably small.

According to the invention, this and other objects are achieved in a magneto-resistance device as described in the opening paragraph, characterised in that the said surface of the substrate is furnished with a plurality of grooves which are substantially mutually parallel, each groove comprising a first face and a second face, all first faces being substantially planar and mutually parallel, the constituent layers of the multilayer structure being provided in a stack upon each said first face in such a manner as to be parallel thereto, the thickness of the stacks in a direction perpendicular to the first faces being such that each stack makes physical contact with each immediately neighbouring stack and overlap each other.

The substrate is preferably composed of non-conducting material, but can otherwise be at least partially coated with a layer of non-conducting material, thus preventing any flow of electrical current through the substrate, whereby any flow of electrical current through the stacked structure is thus confined solely to the electrically conducting multilayer structure. A non-conducting material is hereby essentially understood to be an electrically insulating material or a semiconducting material.

In such a device, the magneto-resistance effect of the multilayer structure is measurable by applying an electrical voltage gradient across the plane of the substrate in an in-plane direction substantially perpendicular to the grooves, thereby inducing a measurable flow of electrical current through the multilayer structure across the grooved surface of the substrate, the current thus flowing from one stack to the next in such a manner that, except in the vicinity of the region of electrical contact between immediately adjacent stacks, its direction is substantially perpendicular to the constituent layers of each stack. Because a plurality of stacks is thus traversed by the flow of current, the absolute values of the electrical resistances so measured are comparable to those measured in the known magneto-resistance device using the lateral measuring geometry. However, due to the substantially perpendicular current flow in each stack, the total magneto-resistance effect of the inventive multilayer structure is much larger than that which can be achieved using the lateral measuring geometry in the known magneto-resistance device.

The inventive multilayer structure as hereinbefore described can be provided by common methods such as vacuum vapour deposition, sputter deposition and laser ablation deposition, whereby the grooved substrate is thus positioned and oriented with respect to the depository flux of material that the flux direction is substantially perpendicular to the first face of each groove. To minimize distortion of the layered structure of each stack by so-called shadowing effects, the multilayer structure is preferably provided by vacuum vapour deposition, due to its characteristically uniform and collimated depository flux.

A preferential embodiment of the magneto-resistance device according to the invention is characterised in that the grooves are substantially V-shaped and immediately adjacent, whereby the perpendicular separation $d_1$ of consecutive first faces and the perpendicular separation $d_2$ of consecutive second faces both lie in the range 0.01–10 μm. A V-shaped groove is hereby essentially understood to be a groove consisting of two faces which mutually subtend an internal angle lying in the range 0–180 degrees, and preferably lying in the range 60–120 degrees. Grooves of this geometrical form and pitch can be etched into the substrate surface with relative ease, and perpendicular separations in the cited range of 0.01–10 μm match well with commonly employed total thicknesses of the multilayer structure, bearing in mind that such thicknesses must substantially exceed the value $d_1$ without significantly approaching the value $2d_1$ if immediately adjacent stacks are to make good electrical contact with one another, which contact is nevertheless sufficiently limited in spatial extent to ensure that any electrical current laterally traversing the multilayer structure is forced to flow through a relatively large portion of each stack in a substantially perpendicular direction. Apart from etching, other techniques such as pressing may be used to provide the substrate with grooves.

A further advantageous embodiment of the inventive stacked structure is characterised in that the substrate comprises a monocrystalline material selected from the group formed by Si, Ge, all II–VI semiconducting compounds, all III–V semiconducting compounds, and mixtures thereof. These materials may be either undoped or doped. For example, InP can be doped with Fe so as to achieve a material resistivity in the range 1–100 MΩ cm, whereby this material can be classified as nonconducting. The high degree of crystalline perfection of these single crystal substrate materials allows them to be very accurately, finely and smoothly etched along natural crystal planes.

Particularly suitable substrates in this category are InP and Si single crystals. These can be neatly cleaved along a (100) or a (211) crystal plane, wherein parallel grooves can be subsequently etched in such a manner that each first face is a (111) crystal plane. The etching process can be satisfactorily conducted with KOH solution (for Si) or brominated HBr solution (for InP), using, for example, the method elucidated by Matsuoka et at. in J. Electrochem. Soc. 133 (1986), pages 2485–2491. Because the stacks deposited on each first face are very narrow (of the order of a micron in width), it is important that the first faces themselves are very smooth, if the layered structure deposited thereon is not to be drastically distorted by substrate roughness perpetuated throughout the layers. In this context, exposed crystal planes yield the highest possible surface quality.

As already stated hereabove, any lateral flow of electrical current through the multilayer structure will be substantially perpendicular to the constituent layers of each stack, except in the vicinity of the region of electrical contact between immediately adjacent stacks, where it will be substantially in-plane. The net magneto-resistance effect of each stack will therefore consist (respectively) of a "perpendicular" contribution and an "in-plane" contribution. However, the larger the value of $d_1$ compared to $d_2$, the larger will be the portion of each stack in which the electrical current is perpendicular, as compared to that portion thereof in which the electrical current is in-plane. Setting $d_1 > d_2$ therefore increases the relative share of the "perpendicular" contribution in the net magneto-resistance effect of the whole stack, at the expense of the "in-plane" contribution. Since the "perpendicular" magneto-resistance effect is intrinsically substantially larger than its "in-plane" counterpart, as demonstrated in experiments comparing the perpendicular and lateral measuring geometries, the net magneto-resistance effect of each stack will hereby be advantageously increased.

A particularly advantageous embodiment of the magneto-resistance device according to the invention is characterised in that each stack consecutively comprises a first highly conductive metallic layer of thickness $d_C < d_1$, followed by a multilayer of total thickness $d_1 - d_C$, followed in turn by a second highly conductive metallic layer of approximate thickness $d_C$. It is to be understood hereby that $d_C$ is relatively large, having a typical magnitude in the range 5%–50% of $d_1$. Examples of suitable metals for such highly conductive metallic layers are Cu, Al, Au, Ag, and combinations thereof. In such a multilayer structure, the electrical connection between consecutive stacks is formed entirely by the highly conductive metallic layers, in which the flow of electrical current will be essentially in-plane. Since any magneto-resistance effect in these layers is negligible compared to that demonstrated by the multilayer part of each stack, the net magneto-resistance effect of each stack will thus consist entirely of the "perpendicular" contribution discussed in the previous paragraph. In addition, because the electrical resistivity of the highly conductive metallic layers is considerably smaller than that of the multilayer part of each stack (by about a factor of ten), the total resistance of each stack will be correspondingly reduced in comparison with a similar stack not having the said highly conductive metallic layers. The loss of an "in-plane" magneto-resistance contribution causes a certain relative decrease in the numerator of Formula (1), but the accompanying reduction of the total electrical resistance of each stack causes a far greater relative decrease in the denominator of Formula (1). The end result is thus a substantial increase of the net magneto-resistance effect of each stack.

The great advantage offered by the geometry of the stacked structure as elucidated hereinbefore is complimented by careful choice of the most appropriate materials for the multilayer structure. In this respect, a preferential embodiment of the inventive magneto-resistance device is characterised in that each stack comprises at least one multiplet of metallic layers selected from the group formed by Fe/Cr/Fe, Co/Ag/Co, Co/Cu/Co, MnFe/NiFe/Cu/NiFe, $Ni_xFe_yCo_z$/

Cu/Ni$_X$Fe$_Y$Co$_Z$, Ni$_X$Fe$_Y$Co$_Z$/Ag/Ni$_X$Fe$_Y$Co$_Z$, Ni$_X$Fe$_Y$Co$_Z$/ Co/Cu/Co/Ni$_X$Fe$_Y$Co$_Z$, Ni$_X$Fe$_Y$Co$_Z$/Co/Ag/Co/ Ni$_X$Fe$_Y$Co$_Z$, and combinations thereof, whereby the individual values of X, Y, Z, X', Y' and Z' all lie in the range 0 to 1, and X+Y+Z=1= X'+Y'+Z'. These multiplets each comprise two layers of ferromagnetic material which, for appropriately chosen layer thicknesses and compositions, are antiferromagnetically oriented across an interposed non-magnetic metallic layer. Such antiferromagnetically-oriented layers are essential for the occurrence of so-called spin-valve magneto-resistance, which is generally of much greater magnitude than either the classical or the anomalous magneto-resistance effects also occurring in such a structure. The multilayer structure can, of course, comprise a plurality of such multiplets, either of a single type or of mixed types, and may also be deposited on a metallic buffer layer, if so desired. A full exemplary multilayer composition as here elucidated is discussed in more detail by Jimbo et at. in Jpn. J. Appl. Phys. 31 (1992), pages L 1348–L 1350.

BRIEF DESCRIPTION OF THE DRAWINGS

The invention and its attendant advantages will be further elucidated with the aid of embodiments and the accompanying drawings, not all of uniform scale, whereby.

DETAILED DESCRIPTION OF THE PREFERRED EMBODIMENTS

Embodiment 1

Figure 1:
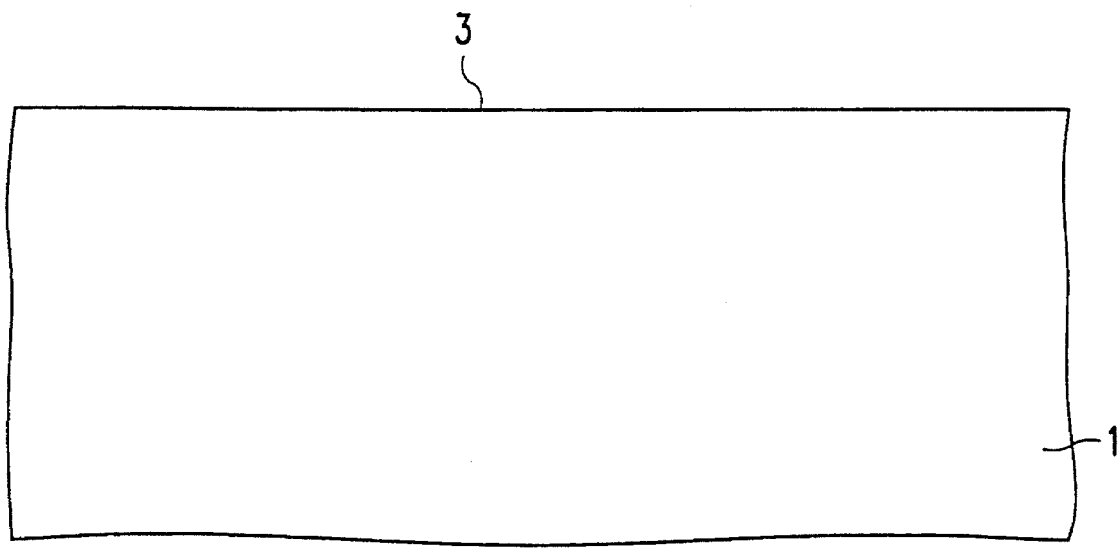
FIG. 1 depicts a cross-section of part of a non-conducting substrate suitable for application in a magneto-resistance device according to the invention.

FIGS. 1–4 render a cross-sectional view of parts of a particular embodiment of a stacked structure for use in a magneto-resistance device according to the invention. Identical parts occurring in different Figures are consistently denoted by the same reference numerals.

FIG. 1 renders a cross-sectional view of an InP single crystal 1 which has been cleaved so as to expose a (100) crystal plane 3.

Figure 2:
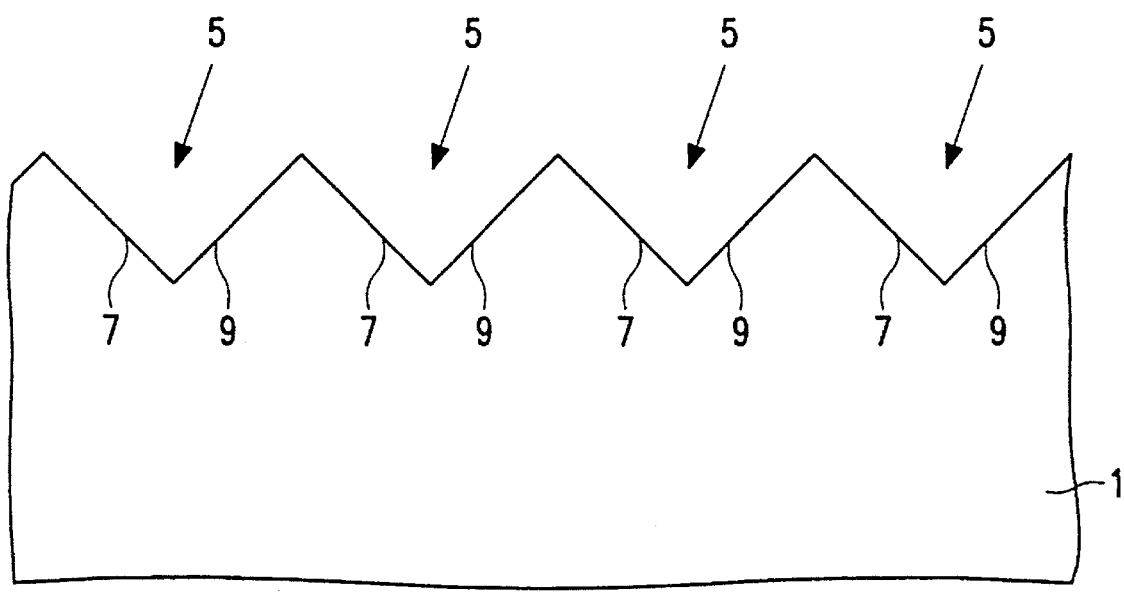
FIG. 2 shows a cross-section of part of the same substrate as rendered in FIG. 1, after provision of one of its surfaces with grooves according to the invention.

In FIG. 2, immediately adjacent V-shaped grooves 5 have been etched into the surface 3, each groove consisting of a first face 7 and a second face 9, both of which are planar. The etching is so conducted that each first face 7 is a (111) crystal plane, thus guaranteeing mutual parallelism of all first faces 7. Each second face 9 is also a (111) crystal plane.

Figure 3:
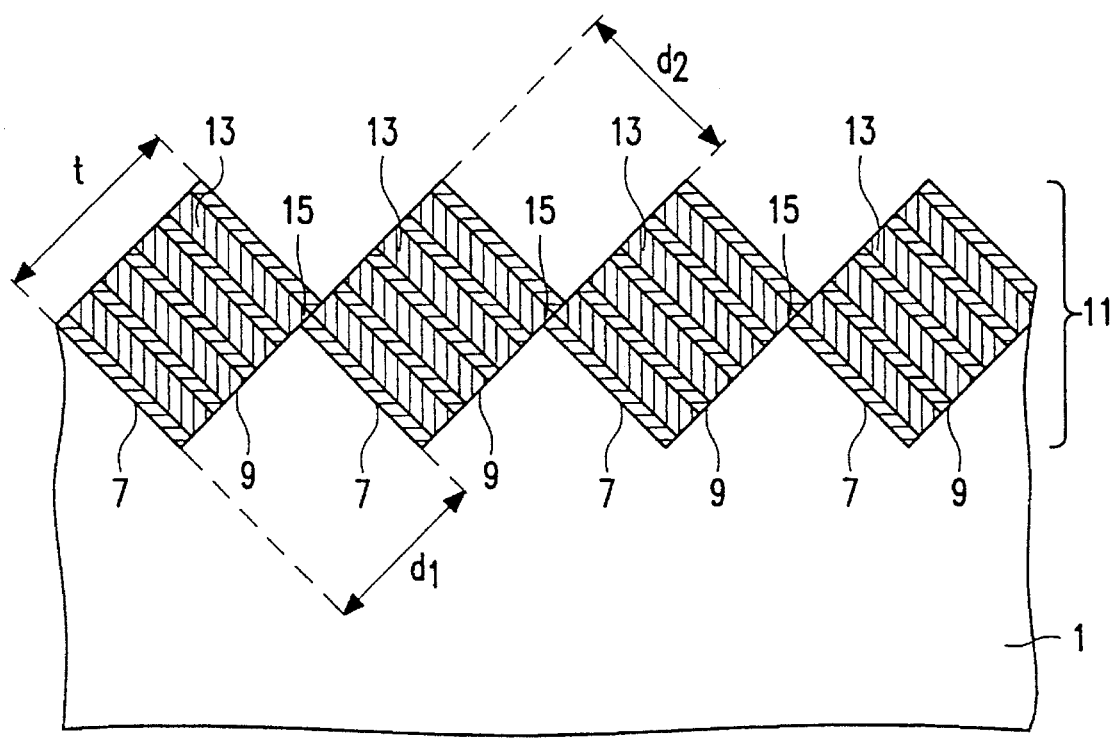
FIG. 3 is a schematic depiction of the grooved substrate shown in FIG. 2, subsequent to deposition of an inventive multilayer structure thereupon.

In FIG. 3, the grooved substrate 1 has been furnished with a multilayer structure 11 which comprises stacks 13 deposited on each first face 7. The stacks 13 have been thus deposited that their constituent layers are parallel to the first faces 7. Furthermore, the thickness t of each stack 13 is greater than the perpendicular separation d$_1$ of consecutive first faces 7, so that each stack 13 has regions 15 of direct contact with each immediately neighbouring stack. The width of each stack 13 is equal to the perpendicular separation d$_2$ of consecutive second faces 9.

Figure 4:
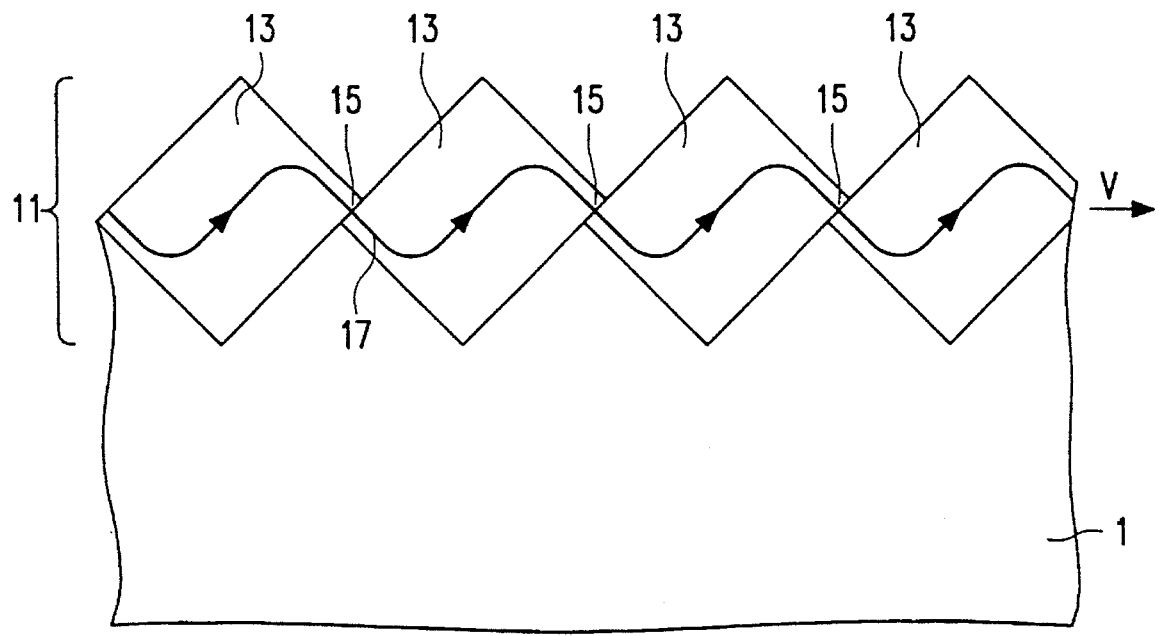
FIG. 4 is an outline rendition of FIG. 3, schematically depicting the path of an electrical current induced by an electrical voltage gradient applied across the plane of the substrate.

FIG. 4 is a schematic outline of FIG. 3, whereby a voltage gradient V is applied in the indicated direction across the plane of the substrate 1. Since the material of the stacks 13 is electrically conducting, and since neighbouring stacks 13 are in mutual electrical contact via the regions 15, an electrical current 17 will be induced in the multilayer structure 11. This electrical current 17 will follow the schematically-depicted path of minimum electrical resistance, being substantially perpendicular to the constituent layers of each stack 13, except in the electrical contact regions 15.

Embodiment 2

Figure 5:
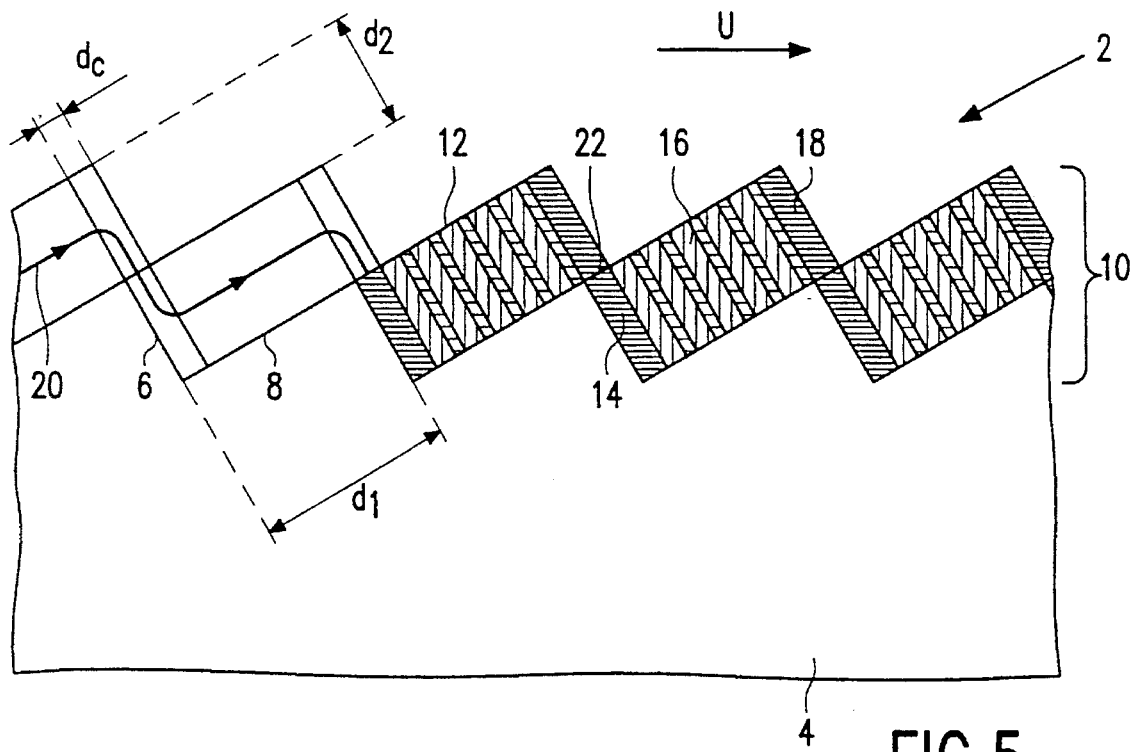
FIG. 5 depicts a cross-section of part of a stacked structure according to the invention.
Figure 6:
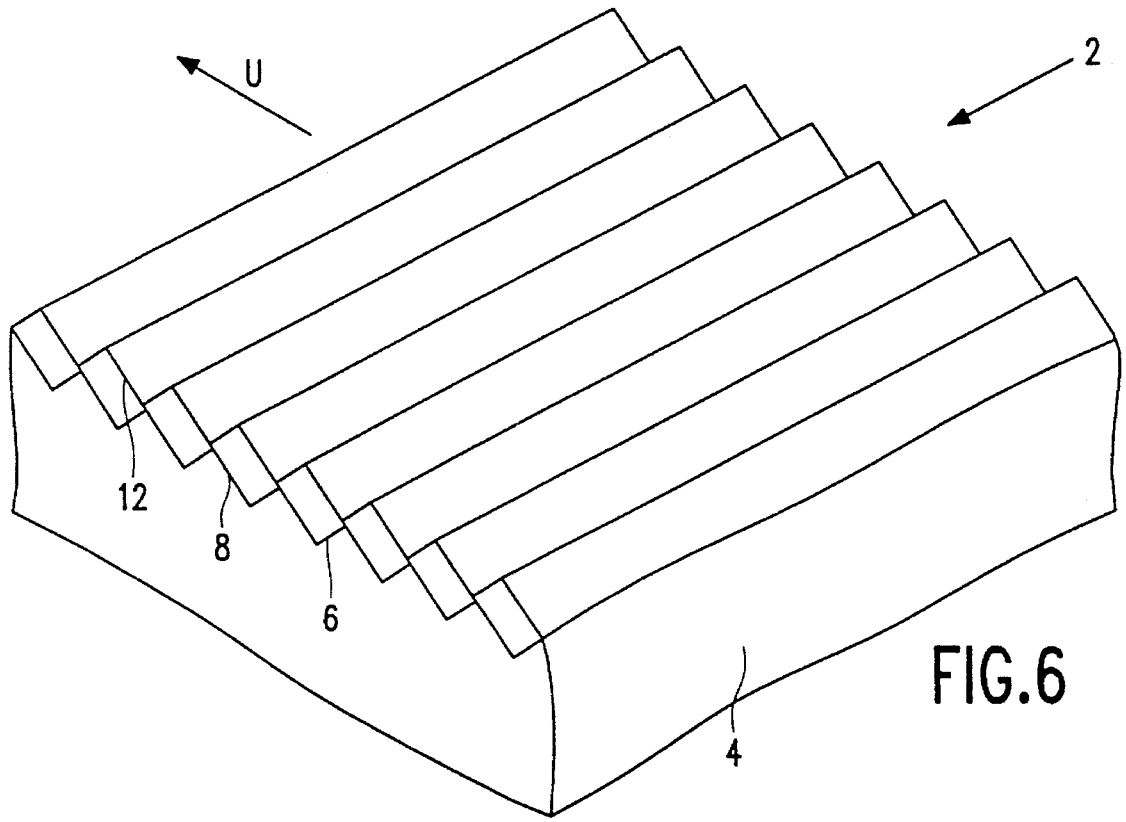
FIG. 6 renders a partial perspective view of the stacked structure depicted in FIG. 5.

FIGS. 5 and 6 depict a particular embodiment of a stacked structure for use in a magneto-resistance device according to the invention. Identical parts occurring in both Figures are indicated by the same reference numerals.

FIG. 5 is a schematic cross-sectional view of part of a particular embodiment of a stacked structure 2 according to the invention. A substrate 4 has been furnished with immediately adjacent straight V-shaped grooves, each groove consisting of a first face 6 and a second face 8. The perpendicular separation d$_1$ of consecutive first faces 6 is substantially larger than the perpendicular separation d$_2$ of consecutive second faces 8. A multilayer structure 10 has also been provided, and comprises stacks 12 deposited on each first face 6. Each stack 12 consecutively comprises a first Cu layer 14 of thickness d$_C$, followed by a multilayer 16 of total thickness d$_1$–d$_C$, followed in turn by a second Cu layer 18 of approximate thickness d$_C$. The two leftmost stacks 12 in the Figure are shown in outline form, so as to allow clear schematic depiction of the path followed by an electrical current 20 induced by an electrical voltage gradient U applied in the indicated direction across the plane of the substrate 4. This electrical current 20 is substantially perpendicular to the constituent layers of each multilayer 16, but is substantially in-plane in each Cu layer 14, 18 and each electrical contact region 22.

FIG. 6 is a partial schematic perspective view of the stacked structure cross-sectionally depicted in FIG. 5.

Embodiment 3

Figure 7:
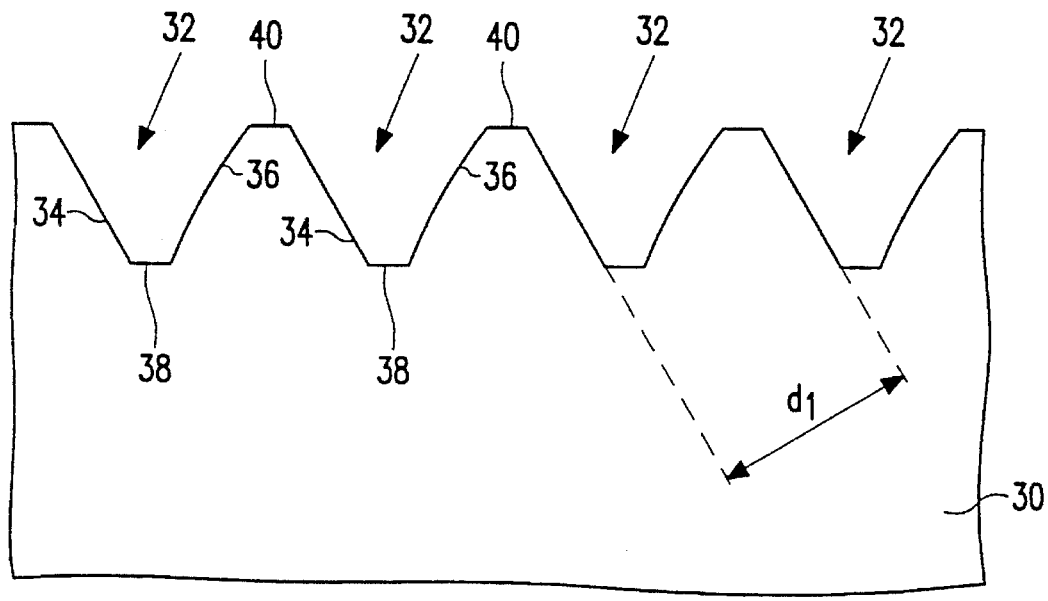
FIG. 7 shows a cross-section of part of an unusually grooved substrate.
Figure 8:
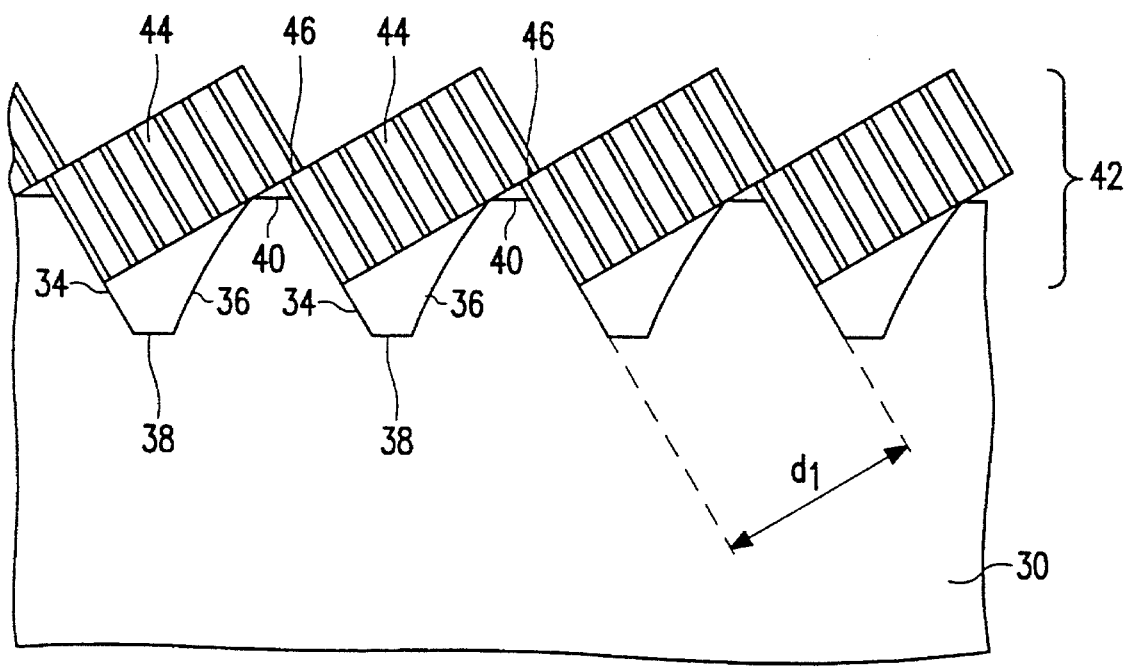
FIG. 8 is a schematic depiction of the grooved substrate shown in FIG. 7, subsequent to deposition of an inventive multilayer structure thereupon.

FIGS. 7 and 8 render a schematic cross-sectional view of parts of a particular embodiment of a stacked structure which can be used in a magneto-resistance device according to the invention. Identical parts in both Figures are denoted by the same reference numerals.

FIG. 7 is a schematic depiction of part of a substrate 30 which can be used in the magneto-resistance device according to the invention, whereby a surface of the substrate 30 has been provided with a plurality of grooves 32. Each groove 32 consists of three faces, being a planar first face 34, a convex second face 36, and a planar third face 38, all first faces 34 being mutually parallel. Neighbouring grooves 32 are mutually separated by facets 40, but are still substantially immediately adjacent, since the width of the facets 40 is about an order of magnitude smaller than $d_1$.

FIG. 8 is a schematic depiction of the grooved substrate 30 shown in FIG. 7, subsequent to deposition of a multilayer structure 42 thereupon. The multilayer structure 42 comprises stacks 44 whose constituent layers are parallel to the first faces 34. Because the facets 40 are not perpendicular to the first faces 34, the process of deposition of the multilayer structure 42 on the grooved substrate 30, whereby the substrate 30 was thus canted that the depository flux of material was perpendicular to the first faces 34, will have caused a certain amount of material to be deposited on the facets 40 also. As a result, the layered geometry at the edges of each stack 44 will be slightly distorted (not depicted in the Figure). Such distortion does not prevent the formation of electrical contact regions 46 between immediately neighbouring stacks 44.

Embodiment 4

Figure 9:
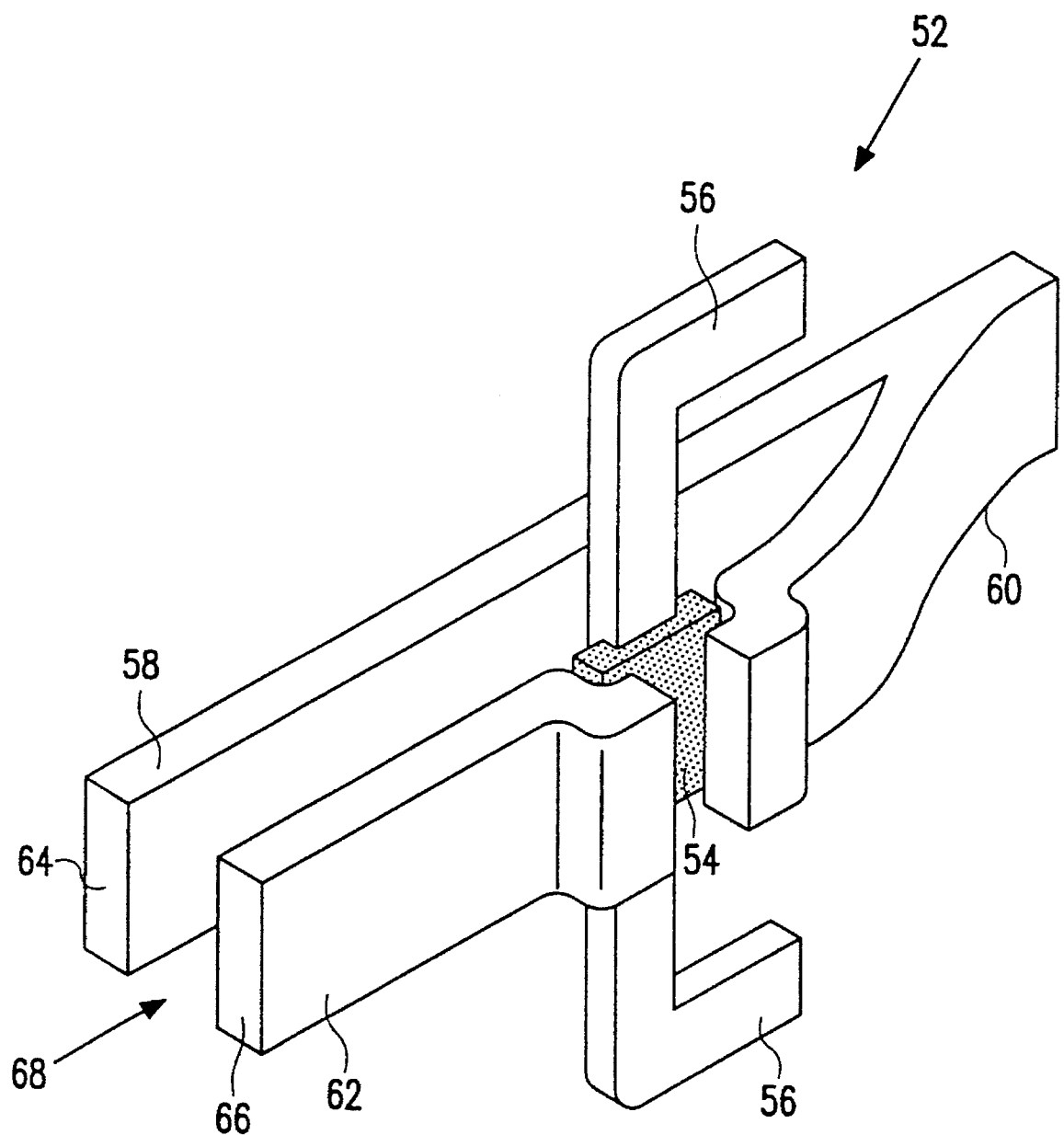
FIG. 9 schematically depicts a magnetic head comprising a magneto-resistance device in accordance with the invention.

FIG. 9 is a schematic perspective view of a magnetic head 52 comprising an inventive magneto-resistance device 54 with electrical connections 56. The head 52 further comprises a substrate 58, which is comprised of a magnetic material (such as a ferrite) or of a non-magnetic material on which a layer of magnetic material (such as NiFe) is deposited. The head 52 additionally comprises flux guides 60, 62, which are positioned relative to the device 54 and the substrate 58 so as to form a magnetic circuit. The end faces 64, 66 form part of the pole face of the magnetic head 52, the magnetic gap 68 being located between said faces 64, 66.

If a magnetic medium, such as a magnetic tape or disc, passes before the faces 64, 66 in close proximity thereto, the magnetically-stored information on that medium will generate a varying magnetic flux in the above-mentioned magnetic circuit, which magnetic flux is also fed through the magneto-resistance device 54. The device 54 transcribes this varying magnetic flux into electrical resistance variations, which can be measured via the electrical connections 56.

The magnetic head may also contain an electrical coil, which can be employed in the recording of magnetic information on magnetic media.

Embodiment 5

Figure 10:
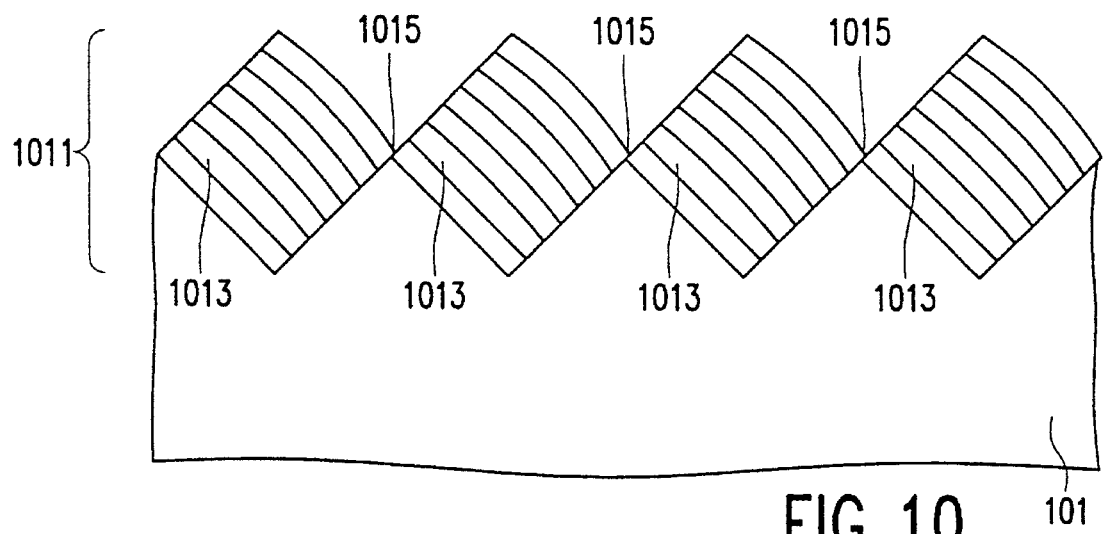
FIG. 10 renders a cross-sectional view of part of a stacked structure according to the invention.
Figure 11:
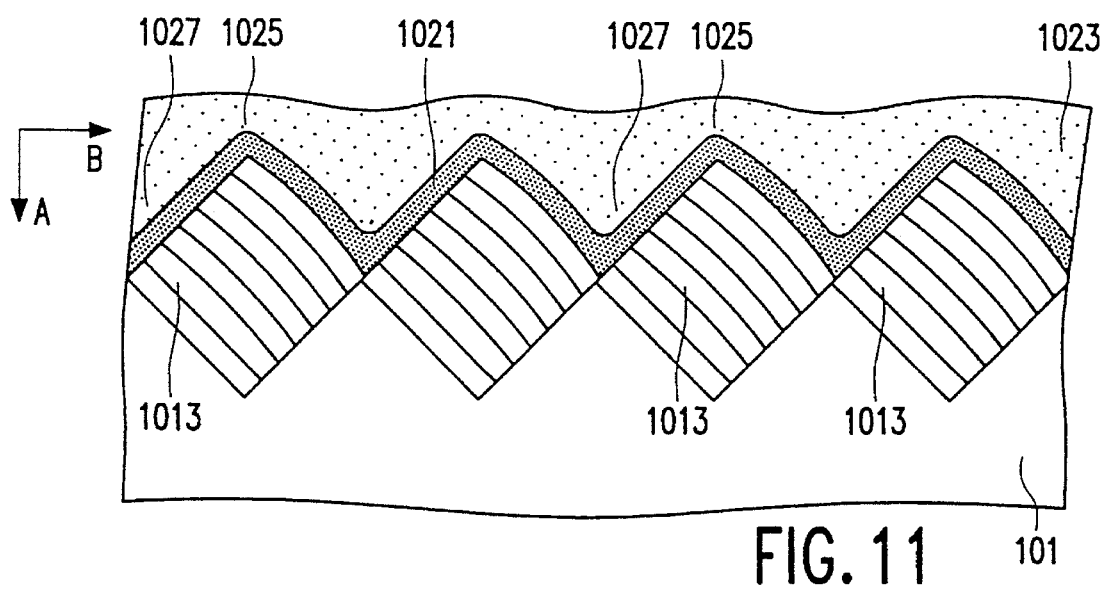
FIG. 11 shows the subject of FIG. 10, now successively blanketed with a layer of Au and thinned photoresist.
Figure 12:
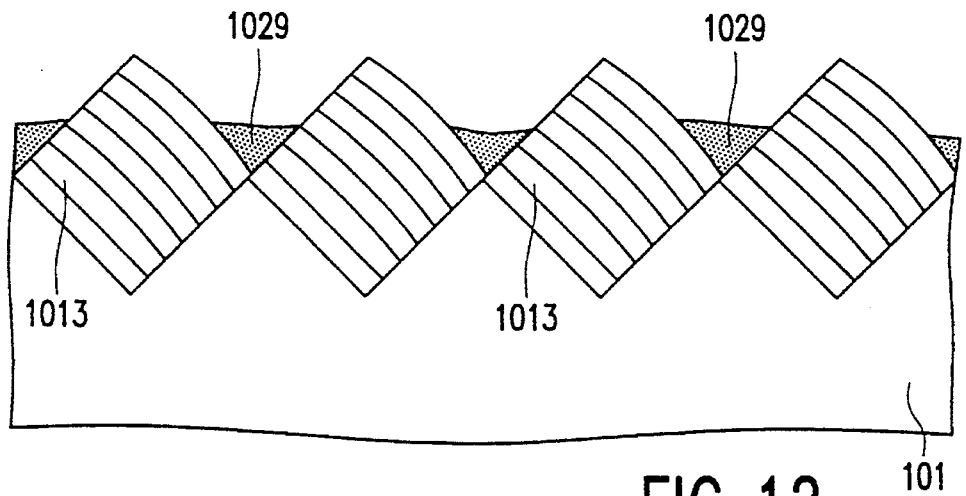
FIG. 12 depicts the subject of FIG. 11, after its subjection to an etching routine.

FIGS. 10–12 render a cross-sectional view of parts of a particular embodiment of a stacked structure for use in a magneto-resistance device according to the invention. Corresponding parts in the various Figures are denoted by identical reference labels.

The stacked structure of FIG. 10 is similar to that of FIG. 3, except that the individual layers of the stacks 1013 are somewhat curved, e.g. as a result of surface tension effects. As a result, the extent of the mutual electrical contact in the regions 1015 between neighbouring stacks 1013 may be considerably smaller than that in the regions 15 in FIG. 3, so that the quality of the electrical connection between neighbouring stacks in the present case may be unsatisfactory. Such a potential problem can be alleviated using, for example, the technique hereinafter discussed and further illustrated in FIGS. 11 and 12.

In FIG. 11, the stacks 1013 have been blanketed with an essentially uniform layer 1021 of Au, e.g. by evaporation or sputtering in the direction A, or by means of an electroplating procedure. This Au layer 1021 is subsequently spin-coated with a layer 1023 of thinned HPR photoresist. By virtue of the very nature of the spin-coating procedure, in combination with the stepped geometry of the stacked structure, the thickness of the layer 1023 is much smaller at the "peaks" 1025 than in the "valleys" 1027.

The layer 1023 is subsequently thinned, using an appropriate reactive ion etching procedure, so that portions of the underlying Au layer 1021 are exposed at the peaks 1025. The stacked structure is then treated with a Au-etching solution, such as aqueous KCN. Appropriately-timed interruption of this etching procedure will result in the remainder of small Au "fillers" 1029 between neighbouring stacks 1013, as depicted in FIG. 12. The presence of such fillers improves the mutual electrical contact between the stacks, as desired.

Needless to say, such a procedure for the provision of supplementary conductive metal fillers between the neighbouring stacks of the inventive stacked structure can also be enacted for the "straight-layered" structures depicted in FIGS. 3, 5 and 8.

We claim:

1. A magneto-resistance device comprising a stacked structure, said stacked structure comprising a substrate having a surface on which multilayer structures are provided, characterized in that the surface is furnished with a plurality of grooves which are substantially mutually parallel, each groove comprising a first face and a second face, all first faces being substantially planar and mutually parallel, the constituent layers of each multilayer structure being provided in a stack upon each said first face in such a manner as to be parallel thereto, the thickness of the stacks in a direction perpendicular to the first faces being such that adjacent faces, parallel to the first faces, of immediately neighboring stacks make physical contact with, and overlap each other.

2. A magneto-resistance device according to claim 1, characterised in that the grooves are substantially V-shaped and immediately adjacent, whereby perpendicular separation $d_1$ of consecutive first faces and perpendicular separation $d_2$ of consecutive second faces both lie in the range 0.01–10 μm.

3. A magneto-resistance device according to claim 1, characterised in that the substrate comprises a monocrystalline material selected from the group consisting of Si, Ge, the II–VI semiconducting compounds, the III–V semiconducting compounds, and mixtures thereof.

4. A magneto-resistance device according to claim 3, characterised in that the substrate is an InP or Si single crystal in which the grooves are etched into a (100) or (211) crystal plane in such a manner that each first face is a (111) crystal plane.

5. A magneto-resistance device according to claim 2, characterised in that $d_1 > d_2$.

6. A magneto-resistance device according to claim 2, characterised in that every stack consecutively comprises a first highly conductive metallic layer of thickness $d_C < d_1$, followed by a multilayer of total thickness $d_1 - d_C$, followed in turn by a second highly conductive metallic layer of approximate thickness $d_C$.

7. A magneto-resistance device according to claim 1, characterised in that every stack comprises at least one multiplet of metallic layers selected from the group consisting of Fe/Cr/Fe, Co/Ag/Co, Co/Cu/Co, MnFe/NiFe/Cu/NiFe, $Ni_XFe_YCo_Z/Cu/Ni_{X'}Fe_{Y'}Co_{Z'}$, $Ni_XFe_YCo_Z/Ag/Ni_{X'}Fe_{Y'}Co_{Z'}$, $Ni_XFe_YCo_Z/Co/Cu/Co/Ni_{X'}Fe_{Y'}Co_{Z'}$, $Ni_XFe_YCo_Z/Co/Ag/Co/Ni_{X'}Fe_{Y'}Co_{Z'}$, and combinations thereof, whereby the individual values of X, Y, Z, X', Y' and Z' all lie in the range 0 to 1, and $X+Y+Z=1=X'+Y'+Z'$.

8. A magneto-resistance device according to claim 2, characterised in that the substrate comprises a monocrystalline material selected from the group consisting of Si, Ge, the II–VI semiconducting compounds, the III–V semiconducting compounds, and mixtures thereof.

9. A magneto-resistance device according to claim 5, characterised in that every stack consecutively comprises a first highly conductive metallic layer of thickness $d_C < d_1$, followed by a multilayer of total thickness $d_1 - d_C$, followed in turn by a second highly conductive metallic layer of approximate thickness $d_C$.

10. A magneto-resistance device according to claim 2, characterised in that every stack comprises at least one multiplet of metallic layers selected from the group consisting of Fe/Cr/Fe, Co/Ag/Co, Co/Cu/Co, MnFe/NiFe/Cu/NiFe, $Ni_XFe_YCo_Z/Cu/Ni_{X'}Fe_{Y'}Co_{Z'}$, $Ni_XFe_YCo_Z/Ag/Ni_{X'}Fe_{Y'}Co_{Z'}$, $Ni_XFe_YCo_Z/Co/Cu/Co/Ni_{X'}Fe_{Y'}Co_{Z'}$, $Ni_XFe_YCo_Z/Co/Ag/Co/Ni_{X'}Fe_{Y'}Co_{Z'}$, and combinations thereof, whereby the individual values of X, Y, Z, X', Y' and Z' all lie in the range 0 to 1, and $X+Y+Z=1=X'+Y'+Z'$.

11. A magneto-resistance device according to claim 3, characterised in that every stack comprises at least one multiplet of metallic layers selected from the group consisting of Fe/Cr/Fe, Co/Ag/Co, Co/Cu/Co, MnFe/NiFe/Cu/NiFe, $Ni_XFe_YCo_Z/Cu/Ni_{X'}Fe_{Y'}Co_{Z'}$, $Ni_XFe_YCo_Z/Ag/Ni_{X'}Fe_{Y'}Co_{Z'}$, $Ni_XFe_YCo_Z/Co/Cu/Co/Ni_{X'}Fe_{Y'}Co_{Z'}$, $Ni_XFe_YCo_Z/Co/Ag/Co/Ni_{X'}Fe_{Y'}Co_{Z'}$, and combinations thereof, whereby the individual values of X, Y, Z, X', Y' and Z' all lie in the range 0 to 1, and $X+Y+Z=1=X'+Y'+Z'$.

12. A magneto-resistance device according to claim 4, characterised in that every stack comprises at least one multiplet of metallic layers selected from the group consisting of Fe/Cr/Fe, Co/Ag/Co, Co/Cu/Co, MnFe/NiFe/Cu/NiFe, $Ni_XFe_YCo_Z/Cu/Ni_{X'}Fe_{Y'}Co_{Z'}$, $Ni_XFe_YCo_Z/Ag/Ni_{X'}Fe_{Y'}Co_{Z'}$, $Ni_XFe_YCo_Z/Co/Cu/Co/Ni_{X'}Fe_{Y'}Co_{Z'}$, $Ni_XFe_YCo_Z/Co/Ag/Co/Ni_{X'}Fe_{Y'}Co_{Z'}$, and combinations thereof, whereby the individual values of X, Y, Z, X', Y' and Z' all lie in the range 0 to 1, and $X+Y+Z=1=X'+Y'+Z'$.

13. A magneto-resistance device according to claim 5, characterised in that every stack comprises at least one multiplet of metallic layers selected from the group consisting of Fe/Cr/Fe, Co/Ag/Co, Co/Cu/Co, MnFe/NiFe/Cu/NiFe, $Ni_XFe_YCo_Z/Cu/Ni_{X'}Fe_{Y'}Co_{Z'}$, $Ni_XFe_YCo_Z/Ag/Ni_{X'}Fe_{Y'}Co_{Z'}$, $Ni_XFe_YCo_Z/Co/Cu/Co/Ni_{X'}Fe_{Y'}Co_{Z'}$, $Ni_XFe_YCo_Z/Co/Ag/Co/Ni_{X'}Fe_{Y'}Co_{Z'}$, and combinations thereof, whereby the individual values of X, Y, Z, X', Y' and Z' all lie in the range 0 to 1, and $X+Y+Z=1=X'+Y'+Z'$.

14. A magneto-resistance device according to claim 6, characterised in that every stack comprises at least one multiplet of metallic layers selected from the group consisting of Fe/Cr/Fe, Co/Ag/Co, Co/Cu/Co, MnFe/NiFe/Cu/NiFe, $Ni_XFe_YCo_Z/Cu/Ni_{X'}Fe_{Y'}Co_{Z'}$, $Ni_XFe_YCo_Z/Ag/Ni_{X'}Fe_{Y'}Co_{Z'}$, $Ni_XFe_YCo_Z/Co/Cu/Co/Ni_{X'}Fe_{Y'}Co_{Z'}$, $Ni_XFe_YCo_Z/Co/Ag/Co/Ni_{X'}Fe_{Y'}Co_{Z'}$, and combinations thereof, whereby the individual values of X, Y, Z, X', Y' and Z' all lie in the range 0 to 1, and $X+Y+Z=1=X'+Y'+Z'$.

15. A magnetic head comprising a magneto-resistance device of claim 1, a magnetic substrate, flux guides so positioned relative to the magneto-resistive device and the substrate so as to form a magnetic circuit and a magnetic gap provided between end faces of the substrate and a flux guide.

* * * * *